United States Patent
Duby et al.

(10) Patent No.: US 9,933,835 B2
(45) Date of Patent: *Apr. 3, 2018

(54) INTEGRATED CIRCUIT WITH INTERFACE CIRCUITRY, AND AN INTERFACE CELL FOR SUCH INTERFACE CIRCUITRY

(71) Applicant: ARM Limited, Cambridge (GB)

(72) Inventors: Jean-Claude Duby, Grenoble (FR); Mikael Rien, Grenoble (FR)

(73) Assignee: ARM Limited, Cambridge (GB)

( * ) Notice: Subject to any disclaimer, the term of this patent is extended or adjusted under 35 U.S.C. 154(b) by 304 days.

This patent is subject to a terminal disclaimer.

(21) Appl. No.: 14/728,987

(22) Filed: Jun. 2, 2015

(65) Prior Publication Data
US 2015/0346803 A1    Dec. 3, 2015

(30) Foreign Application Priority Data
Jun. 3, 2014   (GB) .................................... 1409865.1

(51) Int. Cl.
*G06F 1/00* (2006.01)
*G06F 1/32* (2006.01)
(Continued)

(52) U.S. Cl.
CPC ............. *G06F 1/3243* (2013.01); *G06F 1/26* (2013.01); *G06F 1/189* (2013.01); *G06F 3/047* (2013.01);
(Continued)

(58) Field of Classification Search
CPC ........... H01L 23/50; H01L 2924/15311; H01L 2224/16225; H05K 2201/10734;
(Continued)

(56) References Cited

U.S. PATENT DOCUMENTS 5,796,299 A    8/1998   Sei et al.
6,078,068 A    6/2000   Tamura
(Continued)

FOREIGN PATENT DOCUMENTS

EP    2244292 A1    10/2010

OTHER PUBLICATIONS

UKIPO Search Report; GB 1409867.7; dated Nov. 17, 2014.
UKIPO Search Report; GB 1409865.1; dated Nov. 18, 2014.

*Primary Examiner* — Xuxing Chen
(74) *Attorney, Agent, or Firm* — Pramudji Law Group PLLC; Ari Pramudji (57) ABSTRACT

An integrated circuit is provided with interface circuitry used to provide an interface between functional circuitry of the integrated circuit and components external to the integrated circuit. The interface circuitry includes a plurality of interface cells having interface components configured to operate from a first power supply. Each interface cell incorporates a power supply line section extending across its width and configured to cooperate with power supply line sections of other interface cells to provide a power supply line structure shared by the plurality of interface cells, for provision of the first power supply to the interface components. Each power supply line section includes a first supply line portion and a second supply line portion, the first supply line portion being sized to support a current carrying constraint of the interface circuitry, while the second supply line portion is sized insufficiently to support that current carrying constraint. Instead, each interface cell is arranged within the interface circuitry such that the second supply line portion is connected to a current carrying structure external to that interface cell, such that the second supply line portion in combination with the connected current carrying structure is sized sufficiently to support the current carrying constraint. Such an approach enables a reduction in the area required for
(Continued)

the power supply line structure, hence enabling a reduction in the size of the interface circuitry, and accordingly a corresponding reduction in the required size of the integrated circuit.

20 Claims, 9 Drawing Sheets

(51) Int. Cl.
*G06F 1/26* (2006.01)
*G06F 3/047* (2006.01)
*G06F 1/18* (2006.01)
*H01L 23/50* (2006.01)
*H05K 9/00* (2006.01)

(52) U.S. Cl.
CPC .... *H01L 23/50* (2013.01); *H01L 2224/16225* (2013.01); *H01L 2924/15311* (2013.01); *H05K 9/0039* (2013.01); *H05K 2201/10522* (2013.01); *H05K 2201/10734* (2013.01)

(58) Field of Classification Search
CPC ........ H05K 2201/10522; H05K 9/0039; G06F 1/189; G06F 3/047; G06F 1/3243; G06F 1/26

See application file for complete search history.

(56) References Cited

U.S. PATENT DOCUMENTS

| | | | |
|---|---|---|---|
| 2006/0095872 A1* | 5/2006 | McElvain | G06F 17/5077 716/113 |
| 2007/0044057 A1* | 2/2007 | Kitani | H01L 23/552 257/784 |
| 2007/0097573 A1 | 5/2007 | Agata et al. | |
| 2008/0111255 A1 | 5/2008 | Matsuoka | |
| 2008/0169486 A1 | 7/2008 | Toyoshima et al. | |
| 2008/0212353 A1* | 9/2008 | Huang | G11C 11/413 365/63 |
| 2008/0253045 A1 | 10/2008 | Sato et al. | |
| 2008/0257583 A1* | 10/2008 | Li | H01L 23/49838 174/250 |
| 2009/0212413 A1 | 8/2009 | Fishley et al. | |
| 2010/0025859 A1 | 2/2010 | Inoue | |
| 2015/0349526 A1 | 12/2015 | Duby et al. | |

* cited by examiner

INTEGRATED CIRCUIT WITH INTERFACE CIRCUITRY, AND AN INTERFACE CELL FOR SUCH INTERFACE CIRCUITRY

FIELD OF THE INVENTION

The present invention relates to an integrated circuit with interface circuitry, and to an interface cell for such interface circuitry.

BACKGROUND OF THE INVENTION

Typically an integrated circuit will comprise the functional circuitry needed to perform the processing functions of the integrated circuit, along with interface circuitry (often referred to as input/output (I/O) circuitry) for providing an interface between the functional circuitry and components external to the integrated circuit. The interface circuitry will typically consist of a plurality of interface (I/O) cells used to implement the input/output requirements of the integrated circuit.

Each interface cell typically incorporates a power supply line section extending across its width, and configured to cooperate with the power supply line section of other interface cells (for example by placing a plurality of interface cells side-by-side within the interface circuitry) in order to provide a power supply line structure which is shared by the interface cells and used to provide a power supply to the interface components of the interface cells.

In addition to providing the required power supply, or power supplies, to the interface components of the interface cells, the power supply line structure has to be sized sufficiently to support a current carrying constraint of the interface circuitry. In particular, the I/O cells will typically include electrostatic discharge (ESD) components used to provide ESD protection during ESD events, and as a result the various lines within the power supply line structure need to be sized sufficiently to manage the relatively large currents that arise during such ESD events.

Often the various supply lines of the power supply line structure are provided within the upper metal layers (also referred to as the thick metal layers) of the integrated circuit where they can be sized appropriately to manage the current drawn during such ESD events. However, this results in the area occupied by the power supply line structure becoming relatively large, and in particular the sizing requirements of the power supply line structure are becoming a limiting constraint when seeking to reduce the size of the I/O cells.

As the size of integrated circuits continues to decrease, there is an ever increasing pressure to reduce the size of the I/O cells used to form the interface circuitry of the integrated circuit. This pressure applies irrespective of how the interface circuitry is arranged within the integrated circuit. For example, in area array System-on-Chips (SoCs), several clusters of I/O cells are distributed within the integrated circuit. Alternatively, in an I/O ring arrangement, the interface circuitry takes the form of an I/O ring around the periphery of the integrated circuit and surrounding the functional circuitry of the integrated circuit. In all of these various arrangements, the above-mentioned current carrying constraints (typically due to ESD protection requirements) have limited the reductions that can be made in the size of the power supply line structure provided within the I/O cells, thus limiting the extent to which the area occupied by the I/O circuitry can be reduced, and hence limiting the reductions that can be made in the size of the integrated circuit.

Accordingly, it would be desirable to provide an improved arrangement for providing the necessary power supplies to the interface circuitry of an integrated circuit, whilst enabling the current carrying requirements to continue to be met.

SUMMARY OF THE INVENTION

Viewed from a first aspect, the present invention provides an integrated circuit comprising: functional circuitry comprising functional components configured to perform processing functions required by the integrated circuit; interface circuitry configured to provide an interface between the functional circuitry and components external to the integrated circuit, the interface circuitry comprising a plurality of interface cells having interface components configured to operate from a first power supply; each interface cell incorporating a power supply line section extending across its width and configured to cooperate with the power supply line section of other interface cells to provide a power supply line structure shared by said plurality of interface cells, for provision of the first power supply to the interface components; each power supply line section including a first supply line portion and a second supply line portion, the first supply line portion being sized to support a current carrying constraint of the interface circuitry, and the second supply line portion being sized insufficiently to support said current carrying constraint; each interface cell being arranged within the interface circuitry such that the second supply line portion is connected to a current carrying structure external to that interface cell, such that the second supply line portion in combination with the connected current carrying structure is sized sufficiently to support said current carrying constraint.

In accordance with the present invention, the power supply line section within an interface cell includes a first supply line portion and a second supply line portion, but whilst the first supply line portion is sized sufficiently to support a currently carrying constraint of the interface circuitry, the second supply line portion is not. However, each interface cell has its second supply line portion connected to a current carrying structure external to that interface cell. As a result, the second supply line portion in combination with the connected current carrying structure is sized sufficiently to support the current carrying constraint.

Since the second supply line portion is not sized sufficiently to support the current carrying constraint, the overall area requirements of the power supply line section are reduced, hence enabling the size of the interface cell to be reduced. Nevertheless, the current carrying constraint can still be met. In particular, the main current carrying constraint in most practical applications is that imposed by the ESD protection requirements, and although the second supply line portion by itself may not be sufficiently sized to handle such currents, in combination with the connected current carrying structure it is sized sufficiently to handle such ESD currents.

Accordingly, through use of the approach of the present invention the area associated with the power supply line structure can be significantly reduced, whilst still enabling the current carrying constraints to be met. As a result, the size of the interface cells can be reduced, hence enabling a reduction in the overall size of the integrated circuit.

There are a number of ways in which the interface cells can be arranged within the interface circuitry. However, in one embodiment, the plurality of interface cells are arranged in pairs along a length dimension perpendicular to the width, such that one interface cell in a pair abuts against the other interface cell in the pair at an edge boundary.

Within such embodiments, for each pair of interface cells a connection may be provided between the second supply line portions of the interface cells of the pair, such that for each interface cell in the pair the current carrying structure external to that interface cell is provided by the second supply line portion of the other interface cell in the pair. Accordingly, the second supply line arrangement provided by interconnecting the second supply line portions of the paired interface cells provides sufficient current carrying capabilities to support the current carrying constraints of the interface circuitry. Such an approach provides a particularly compact and efficient design.

There are a number of ways in which the second supply line portion of each interface cell can be configured. In one embodiment, within each pair of interface cells, the interface cells are configured such that their second supply line portion is provided adjacent said edge boundary. This improves the ease with which the second supply line portion in one interface cell can be connected to the second supply line portion in the other interface cell of the pair.

The interface cells within each pair may be configured differently so as to facilitate the interconnection of their second supply line portions. However, in one embodiment, each pair of interface cells is formed from two identical interface cells, and at the time of providing the pair of interface cells within the interface circuitry the orientation of one interface cell in the pair is flipped in the length dimension with respect to the orientation of the other interface cell of the pair, such that for both interface cells in the pair the second supply line portion is provided adjacent said edge boundary. Such an approach enables the same interface cell design to be used for both interface cells in each pair whilst still allowing the second supply line portions to be readily interconnected.

There are a number of ways in which the second supply line portions of the interface cells in a pair can be connected. However, in one embodiment, each interface cell in the pair comprises a connection area at an end of the interface cell at said edge boundary, via which the connection between the second supply line portions of the interface cells of the pair is made. The connection area can take a variety of forms, but in one embodiment comprises one or more connection pins provided at the end of the interface cell facing the edge boundary. As a result, the connection can be made by abutting the pins in one interface cell against the corresponding pins in the other interface cell of the pair.

Whilst in the above described embodiments, the interface cells are arranged in pairs along the length dimension, with the interface cells in each pair having their second supply line portions interconnected, there is no requirement to arrange the interface cells in this way. Indeed, whilst certain configurations of interface circuitry allow for such pairing of interface cells, such as in the earlier described area array SoCs, other arrangements of the interface circuitry will not support such pairing. For example, in the earlier-mentioned I/O ring arrangement, the interface circuitry takes the form of an I/O ring in which a plurality of interface cells are placed side-by-side around the periphery of the chip to form the I/O ring. Typically, the I/O ring will only be one I/O cell deep, and accordingly it is not possible in such arrangements to place the interface cells in pairs along the length dimension of the cells. However, in accordance with one embodiment, the interface cell can still be arranged for connection to a current carrying structure external to the interface cell, to enable the size reduction benefits of the present invention to be realised.

In particular, in accordance with one embodiment, the power supply line structure is provided in one or more power layers overlying the interface components, the integrated circuit further comprises at least one additional layer overlying the one or more power layers, and the current carrying structure is provided in that at least one additional layer. Hence, in such embodiments, the current carrying structure for one interface cell is not provided by a portion of another interface cell, but instead is provided by a structure provided in the above-mentioned at least one additional layer. In one particular embodiment, this current carrying structure is provided in an area of the at least one additional layer which is otherwise unutilised, hence avoiding any additional area requirement as a result of providing the current carrying structure.

In one embodiment, the at least one additional layer comprises a redistribution layer, each interface cell having a pad access terminal, and the redistribution layer being used to provide a connection path between the pad access terminal and a bump connection external to the integrated circuit. In such an embodiment, the current carrying structure can be provided in an area of the redistribution layer not used for that connection path. Hence, the provision of the current carrying structure does not affect the main purpose of the redistribution layer, and can be accommodated in parts of the redistribution layer that are otherwise unused.

In one embodiment, the interface circuitry is arranged as an interface ring provided around a periphery of the functional circuitry, and the power supply line structure provides at least one power supply line extending around the interface ring.

In one embodiment, each interface cell is arranged in the interface ring such that in a length dimension perpendicular to the width a first end of the interface cell is adjacent the functional circuitry and a second end is remote from the functional circuitry, the second supply line portion being provided in a region nearer the second end than the first end. Hence, the second supply line portion is arranged towards an outer edge of the interface ring.

In one such embodiment, the pad access terminal is positioned between the first end and the second supply line portion, the connection path between the pad access terminal and the bump connection extends in a direction towards the functional circuitry, and the current carrying structure is provided in an area of the redistribution layer at least party overlying the second supply line portion. In such an arrangement, the area of the redistribution layer at least partly overlying the second supply line portion is not used to form the connection path between the pad access terminal and the bump connection, and accordingly the current carrying structure can readily be provided in that area without placing any additional constraints or complexity on the provision of the connection paths within the redistribution layer. Further, it is relatively straightforward to then connect the current carrying structure to the second supply line portion, for example using appropriate via connections.

In one embodiment, the first supply line portion will provide one of an operating voltage level and a ground voltage level for the first power supply, and the second supply line portion will provide the other voltage level not provided by the first supply line portion. In one particular embodiment, the second supply line portion is configured to provide the ground voltage level for the first power supply.

Whilst the interface circuitry is predominantly arranged to operate from a first power supply, the functional circuitry itself may operate from a different power supply, referred to herein as a second power supply. In some such embodiments, at least some of the interface cells will then comprise additional interface components configured to operate from the second power supply. In such instances, the power supply line section of each interface cell may be configured to further include supply line portions used to provide the second power supply to the additional interface components. Hence, in such embodiments the power supply line structure is required to provide multiple different power supplies, and thus the area requirements of the power supply line structure can be particularly problematic. Accordingly, in such embodiments, the use of the above described techniques is particularly beneficial, since it can enable a significant reduction in the area associated with the supply lines provided for one of the power supplies.

The current carrying constraint can arise for a number of reasons. For example, electromigration, resistivity, IR drop, etc. can all give rise to current carrying constraints. However, in one embodiment, the main current carrying constraint is due to electrostatic discharge (ESD) current requirements of the integrated circuit.

Viewed from a second aspect, the present invention provides an interface cell for use within interface circuitry of an integrated circuit, the interface circuitry providing an interface between functional circuitry of the integrated circuit and components external to the integrated circuit, the interface cell comprising: at least one interface component configured to operate from a first power supply; and a power supply line section extending across a width of the interface cell and configured to cooperate with the power supply line section of other interface cells to provide a power supply line structure shared with said other interface cells, in order to provide the first power supply to said at least one interface component; the power supply line section including a first supply line portion and a second supply line portion, the first supply line portion being sized to support a current carrying constraint of the interface circuitry, and the second supply line portion being sized insufficiently to support said current carrying constraint; the second supply line portion being configured for connection to a current carrying structure external to the interface cell, such that the second supply line portion in combination with the connected current carrying structure is sized sufficiently to support said current carrying constraint.

Viewed from a third aspect, the present invention provides a computer storage medium comprising a cell library, the cell library including an interface cell in accordance with the second aspect of the present invention. The computer storage medium can take a variety of forms, including both non-transitory and transitory forms, but in one embodiment is a non-transitory computer storage medium.

BRIEF DESCRIPTION OF THE DRAWINGS

The present invention will be described further, by way of example only, with reference to embodiments thereof as illustrated in the accompanying drawings, in which.

DESCRIPTION OF EMBODIMENTS

Figure 1:
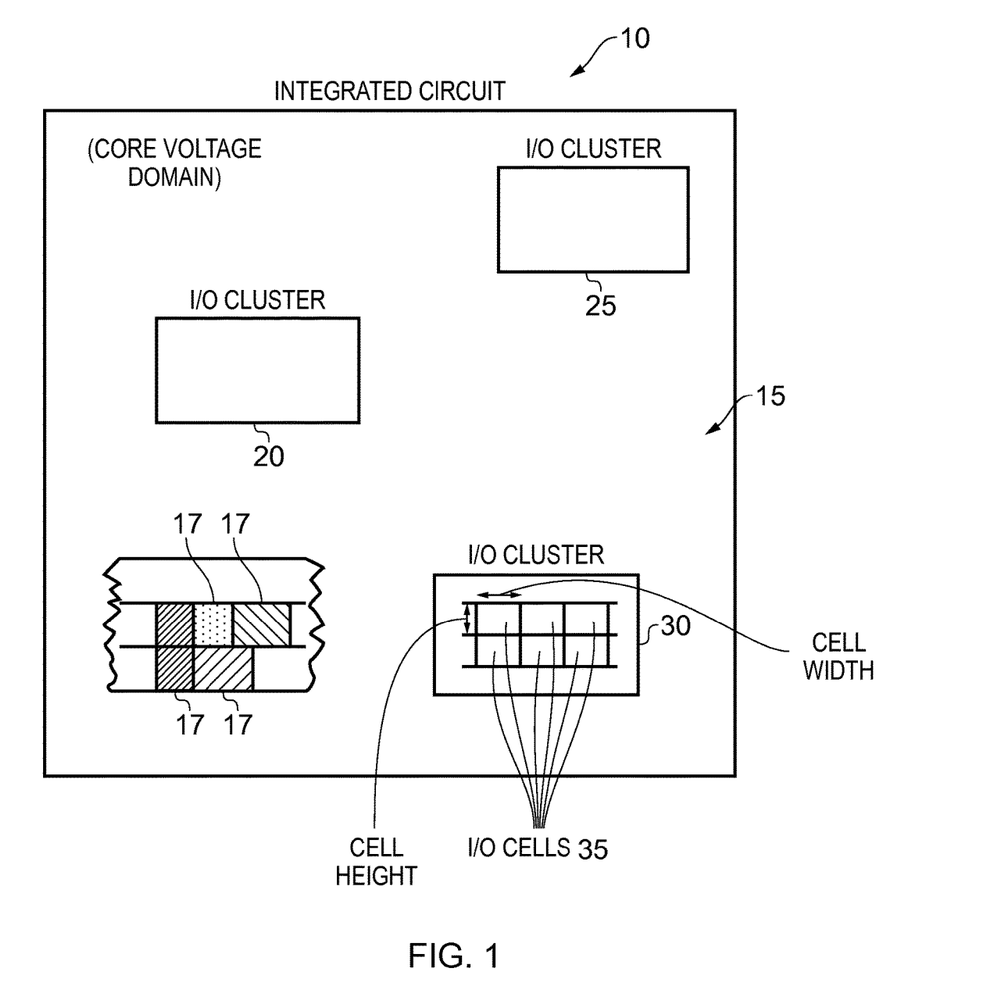
FIG. 1 schematically illustrates an integrated circuit in which the techniques of embodiments can be employed.

FIG. 1 schematically illustrates an integrated circuit in which the techniques of embodiments can be employed. As shown in FIG. 1, the integrated circuit 10 includes functional circuitry 15 comprising a plurality of functional components 17 that are configured to perform the required processing functions of the integrated circuit. There are a number of ways in which the individual functional components can be provided within the functional circuitry 15. For example, in accordance with one known technique, automated tools are provided which use a functional design of a planned integrated circuit (for example in the form of a gate level netlist or a Register Transfer Language higher level representation of the design) and a cell library providing a set of standard cells (standard cells defining the functional components and being "building blocks" for putting together the layout of the integrated circuit according to the functional design) in order to generate the layout of the integrated circuit. In one embodiment, at least some of the functional components 17 of the functional circuitry 15 are formed from such standard cells.

The integrated circuit 10 of FIG. 1 is of an area array form, where several clusters of I/O cells 20, 25, 30 are distributed within the integrated circuit. Each of the I/O clusters 20, 25, 30 will be similarly arranged, although they can be of varying sizes, with different numbers of I/O cells in each cluster. Within a particular I/O cluster, as indicated in FIG. 1 by reference to the example of the I/O cluster 30, various rows of I/O cells 35 are provided. Within each row, the I/O cells are typically placed side-by-side in an abutting arrangement, and each I/O cell will have a cell width and a cell length (the cell length often being referred to as a cell height).

As with the cell library used to provide standard cells for constructing the functional components of the functional circuitry, a cell library may also be used to provide the various I/O cells 35 used to construct each I/O cluster.

Each I/O cell will typically include a power supply line section extending across its width, and a power supply line structure is then formed from multiple power supply line sections by positioning the interface cells in an abutting arrangement such that the power supply line section in one interface cell contacts the power supply line section in an adjacent interface cell. Connecting cells can be used to connect the power supply lines running through one row of I/O cells with the power supply lines running through another row of I/O cells. As a result, a power supply line structure will extend through the interface cells of each cluster, and will be used to provide one or more power supplies to the interface components within those I/O cells. The power supply line structure will typically consist of a plurality of power lines, also referred to herein as power rails.

Figure 2:
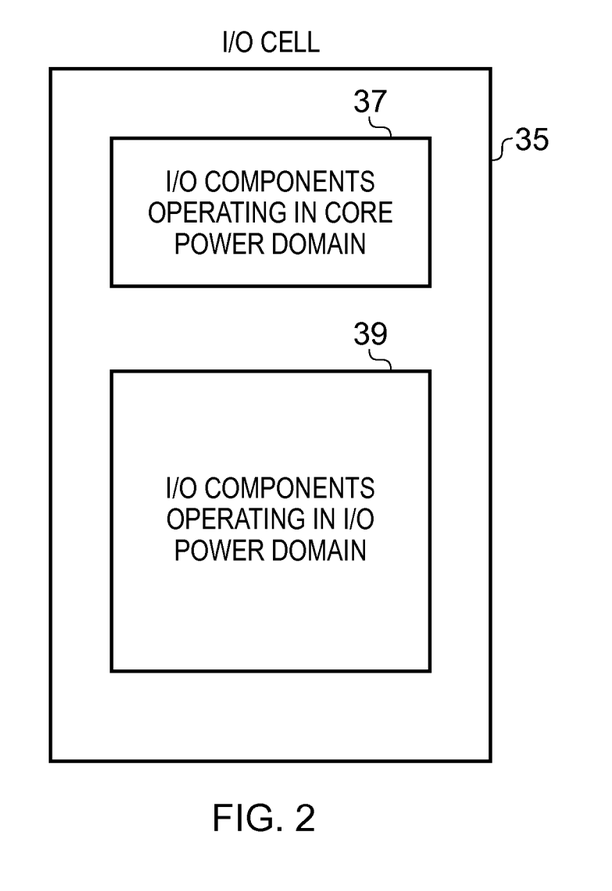
FIG. 2 illustrates how the components within an individual I/O cell may operate from different power domains, in accordance with one embodiment.

Typically the interface circuitry 20, 25, 30 will predominantly operate in an I/O power domain employing a first power supply. In contrast the functional circuitry 15 will typically operate in a core power domain, employing a second power supply different to the first power supply. As shown in FIG. 2, whilst the majority of the components 39 of each I/O cell 35 will typically operate from the first power supply, many of the I/O cells will also include a small number of interface components 37 that operate from the second power supply of the core power domain. Accordingly, it has typically been necessary for the various power lines of the power supply line structure within the I/O clusters to be able to provide both the first power supply and the second power supply.

Figure 3:
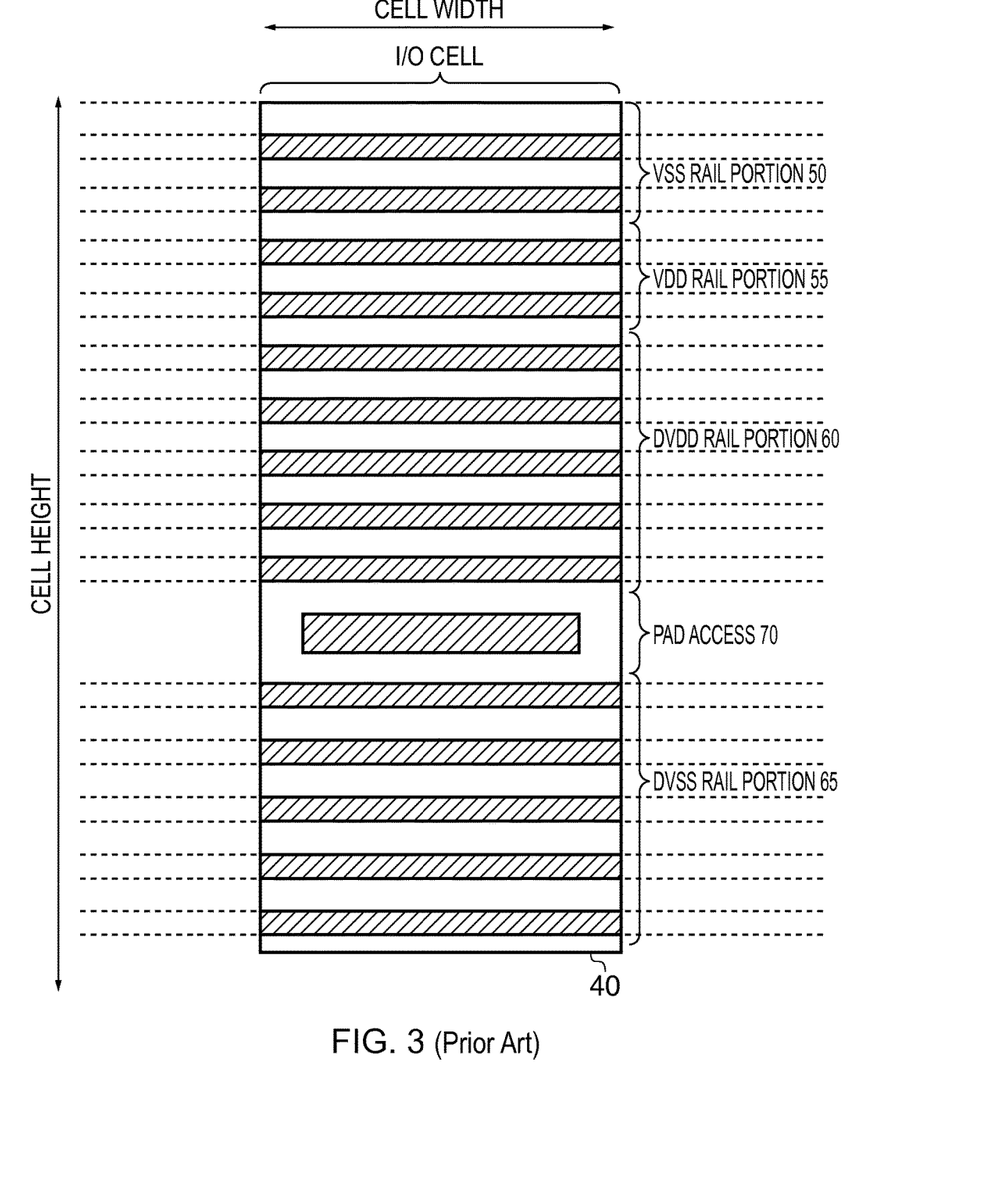
FIG. 3 illustrates a power supply line section associated with an I/O cell in accordance with a prior art arrangement.

FIG. 3 schematically illustrates a known prior art power supply line section provided within an individual I/O cell 40, and arranged to be positioned in an abutting arrangement with the corresponding power supply line sections in adjacent I/O cells in order to produce the power supply line structure. In the example shown, the first power supply of the I/O power domain is provided by an operating voltage portion 60 (also referred to herein as the DVDD rail portion) and a ground voltage portion 65 (also referred to herein as the DVSS rail portion) As mentioned earlier, the majority of the interface components within the I/O cell will take their power supply from these two voltage rail portions.

In addition, two further portions are provided to provide the operating voltage and ground voltage supplies of the second power supply, as illustrated by the VDD rail portion 55 and the VSS rail portion 50 in FIG. 3.

In the embodiment shown in FIG. 3, each of the various portions 50, 55, 60, 65 of the power supply line section is actually implemented by a plurality of metal lines extending across the width of the I/O cell. The number of individual metal lines associated with the DVDD rail portion 60 and the DVSS rail portion 65 will typically be larger than the number of lines provided for the VDD rail portion 55 and the VSS rail portion 50. This is due to the fact that the current carrying requirements in the I/O power domain are typically significantly higher. This is due to the interface components in the I/O cell predominantly using the first power supply of the I/O power domain, and also due to the fact that the relatively high currents observed during ESD events are predominantly channelled through those rail portions 60, 65. The VDD and VSS rail portions typically have to be capable of handling lower currents, and hence do not require as many individual lines.

The actual voltage levels of the first and second power supplies may vary dependent on embodiment. Whilst the second power supply may be 1 Volt or less, the first power supply used in the I/O power domain is typically higher, for example 1.5 Volts, 1.8 Volts or 2.5 Volts.

As also shown in FIG. 3, a pad access connection 70 is typically provided within the same metal layers used to provide the various rail portions, this allowing the I/O cell to be connected to components external to the integrated circuit. As shown in FIG. 3, the various rail portions forming the power supply line section occupy most of the cell height of the I/O cell, and indeed the size requirements of these various rail portions typically places a limit on how much the cell height can be reduced in any particular implementation.

In accordance with the described embodiment, the power supply line section within each I/O cell is redesigned so as to enable a reduction in the area occupied by that power supply line section, and hence enabling a reduction in the size of the I/O cell.

Figure 4:
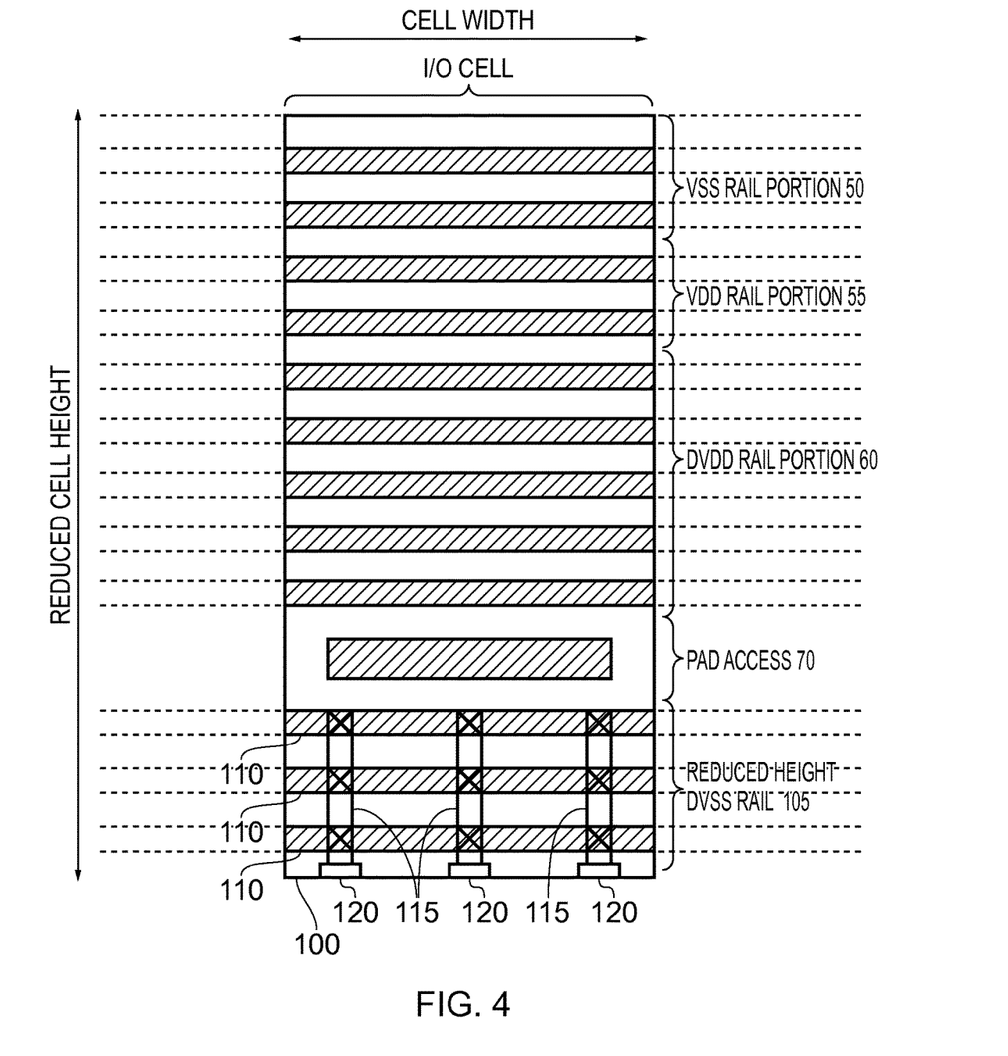
FIG. 4 illustrates a power supply line section associated with an I/O cell in accordance with one embodiment.

In particular, as shown in FIG. 4, the I/O cell 100 retains the VSS rail portion 50, VDD rail portion 55, DVDD rail portion 60 and the pad access connection 70 as per the prior art arrangement of FIG. 3. However, a reduced height DVSS rail 105 is provided instead of the DVSS rail portion 65 of FIG. 3. The individual metal lines 110 within the reduced height DVSS rail portion 105 are shorted together via the connections 115 and associated vias (indicated by the "X"s in FIG. 4). The connections 115 are terminated at connection pins 120 along an edge of the I/O cell.

Whilst the DVDD rail portion 60 is sized sufficiently to support a current carrying constraint of the interface circuitry (typically this constraint being due to ESD current requirements of the integrated circuit), the reduced height DVSS rail portion 105 is not sufficiently sized to support that current carrying constraint. There are a number of ways in which the DVDD rail portion can be sized to sufficiently meet the current carrying constraint. Typically this is done by arranging for the number of individual metal lines in the DVDD rail portion, in combination with their cross-sectional area, to be sufficient to be able to carry the required current imposed by the current carrying constraint. With regard to the reduced height DVSS rail portion 105, the number of individual metal lines and/or the cross-sectional area associated with those lines will be insufficient to enable those lines themselves to be able to carry the current associated with the current carrying constraint.

However, as will be described with reference to the remaining figures, the supply line portion provided by the reduced height DVSS rail portion 105 can be connected with a current carrying structure external to the I/O cell, so that that supply line portion in combination with the connected current carrying structure is sized sufficiently to support the current carrying constraint.

Figure 5:
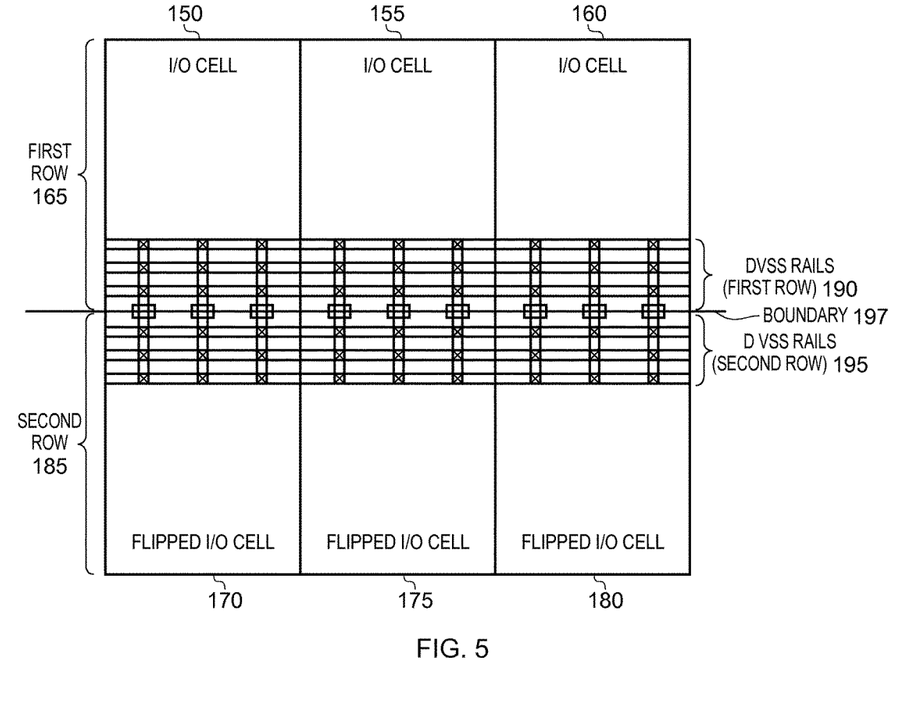
FIG. 5 illustrates how I/O cells may be arranged in pairs along their length dimension in accordance with one embodiment.

One embodiment configuration which can be used to provide this current carrying structure is illustrated schematically in FIG. 5. As shown in FIG. 5, the I/O cells 150, 155, 160 in one row 165 of an I/O cluster are paired with corresponding cells 170, 175, 180 in an adjacent row 185 of the I/O cluster. In one embodiment, all of the I/O cells have the same basic arrangement of rail portions as shown in FIG. 4, but within the second row 185 the orientation of the cells is flipped in the length dimension at the time of providing the interface cells within the interface circuitry, such that for both interface cells in each pair the reduced height DVSS rail portions 105 abut each other along the edge boundary 197. In particular, as shown in FIG. 5, the DVSS rails 190 within the first row 165 are connected via their connection pins 120 with the corresponding DVSS rails 195 in the second row 185.

Hence, in such embodiments, for each cell 150, 155, 160 in the first row 165, the current carrying structure external to that interface cell is provided by the DVSS rails of a corresponding cell in the second row 185. Conversely, for each of the cells 170, 175, 180 in the second row 185, the current carrying structure external to that interface cell is provided by the DVSS rails of a corresponding cell of the first row 165.

As a result, each of the individual I/O cells can have a reduced cell height, whilst still ensuring that the current carrying constraints of the interface circuitry are met.

Figure 6:
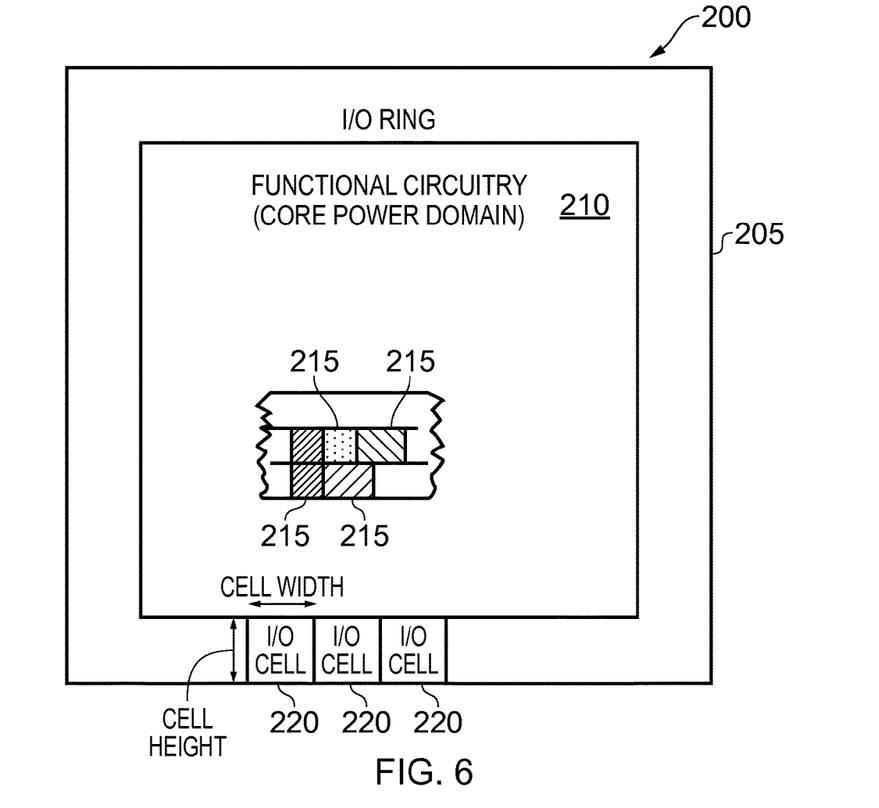
FIG. 6 schematically illustrates an alternative arrangement of integrated circuit in which the techniques of embodiments can be employed.

Whilst the pairing of I/O cells in adjacent rows can provide a very efficient arrangement within integrated circuits employing I/O clusters such as schematically illustrated in FIG. 1, such an approach cannot be used in all situations. In particular, in integrated circuits that employ I/O rings, the individual I/O cells are typically placed side-by-side within the ring and multiple I/O cells are not placed against each other in the length dimension perpendicular to a cell's width. Such an arrangement of integrated circuit is shown in FIG. 6. Here, the integrated circuit 200 includes functional circuitry 210 operating in the core power domain, and consisting of a plurality of functional components 215 configured to perform the processing functions required by the integrated circuit. The individual functional components 215 can be provided using the same techniques as described earlier for the functional components 17 of FIG. 1.

The functional circuitry 210 is surrounded by an I/O ring 205 forming the interface circuitry for providing an interface between the functional circuitry and components external to the integrated circuit. Typically, the I/O ring consists of a plurality of I/O cells 220 for providing particular I/O connections. As with the cell library used to provide standard cells for constructing the functional components of the functional circuitry, a cell library may also be used to provide the various I/O cells 220 used to construct the I/O ring.

As shown in FIG. 6, the I/O cells are typically placed side-by-side in an abutting arrangement such that the power supply line structure is then formed around the I/O ring from multiple power supply line sections by positioning the interface cells in an abutting relationship such that the power supply line section in one interface cell contacts the power supply line section in an adjacent interface cell. In the arrangement shown in FIG. 6, it will be appreciated that the back to back relationship proposed in FIG. 5 will not be applicable to the embodiment of FIG. 6.

However, as will be discussed with reference to the subsequent figures, it is still possible in such an embodiment to provide a current carrying structure external to the interface cell that can be used to combine with the reduced height DVSS rail portion 105 of each I/O cell to provide a current carrying capacity sufficient to support the current carrying constraint. In particular, one of the layers of the integrated circuit can be used for the provision of the current carrying structure, in one embodiment this taking the form of the RDL layer shown in FIG. 7.

Figure 7:
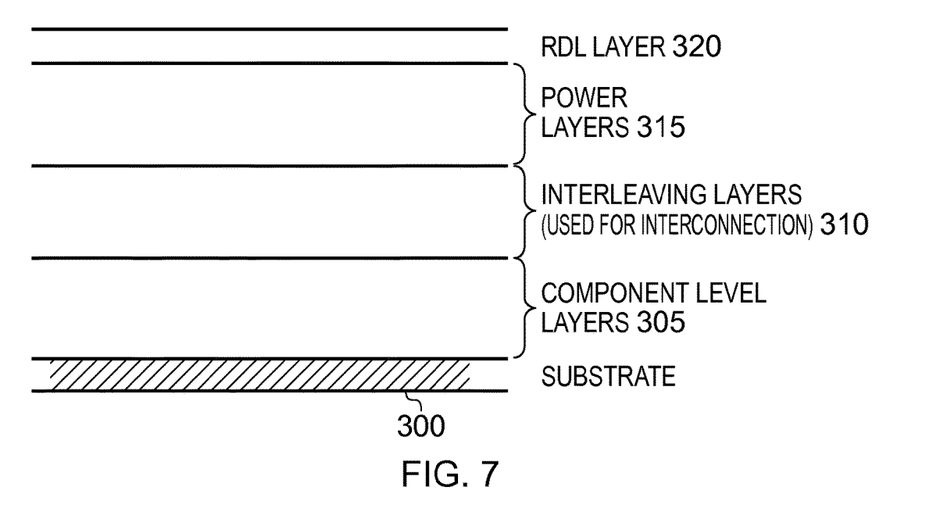
FIG. 7 schematically illustrates various layers provided within the integrated circuit in accordance with one embodiment.

As shown in FIG. 7, the integrated circuit is formed of a plurality of layers established upon a substrate 300, which may for example be a silicon substrate. In particularly, a first plurality of layers established over the substrate 300 form component level layers 305 in which individual functional components are formed within the integrated circuit. In addition, power grid layers 315 are also provided for establishing a power distribution array for the various functional components, and a number of intervening layers 310 are then provided between the power grid layers 315 and the components level layers 305 to provide interconnections between the functional components. These interconnections can take a variety of forms, for example, direct point-to-point connections, bussing structures, etc. In some embodiments, these intervening layers may also be used to perform power biasing functions.

The I/O cells provided within the I/O ring will occupy almost the entire vertical height of the integrated circuit, extending through the component level layers 305, the intervening layers 310, and typically the power grid layers 315. The power supply line sections and pad access connections will typically be provided in the upper metal layers provided as part of the power layers 315.

As shown in FIG. 7, there may also be at least one additional layer above the power layers 315. For example, a redistribution (RDL) layer 320 may be provided to allow connection of certain components to other components external to the integrated circuit. For example, considering the earlier mentioned pad access connections 70 within the various I/O cells, the redistribution layer can be used to provide a connection path between the pad access terminal of an I/O cell and a bump connection external to the integrated circuit. Such bump connections are provided in flip-chip implementations, as will be discussed further with reference to FIG. 8.

Figure 8:
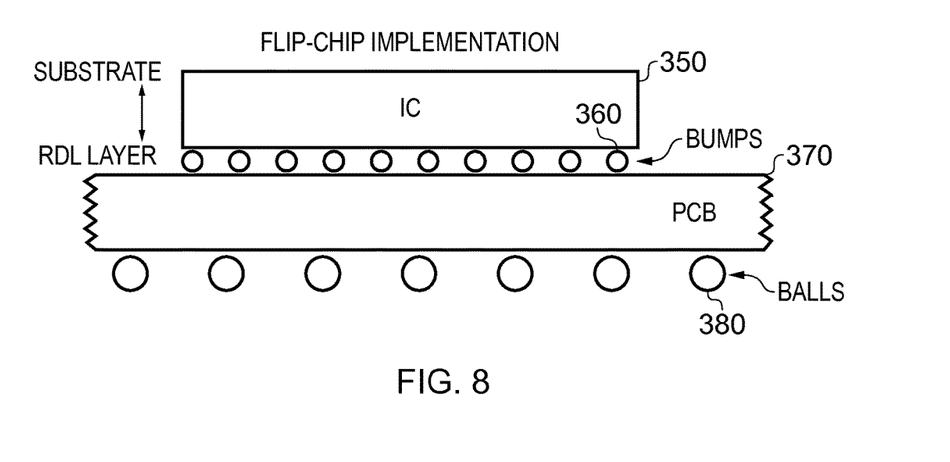
FIG. 8 schematically illustrates a flip-chip implementation in which the techniques of certain embodiments may be utilised.

FIG. 8 schematically illustrates a flip-chip implementation. In such an implementation, a printed circuit board (PCB) 370 is provided with a number of connection balls 380, and each integrated circuit provided on the PCB 370 is coupled to the PCB via a plurality of bumps 360. One such integrated circuit is shown by the integrated circuit 350 in FIG. 8. The integrated circuit is mounted onto the PCB in an inverted ("flipped") arrangement, such that the substrate is remote from the PCB, and the RDL layer provides the contact layer for the bumps 360 connecting the integrated circuit 350 with the PCB 370.

The bumps are formed as an array in both the x and y dimensions, providing a great deal of flexibility for connection of external signals to particular blocks of functional components within the integrated circuit 200. In particular, there is no need for all such signals to be routed onto the integrated circuit 200 via the I/O ring. Further, the I/O cells can be connected via their pad access connection 70 to a wide variety of different bump connections, hence increasing routing flexibility.

Figure 9A:
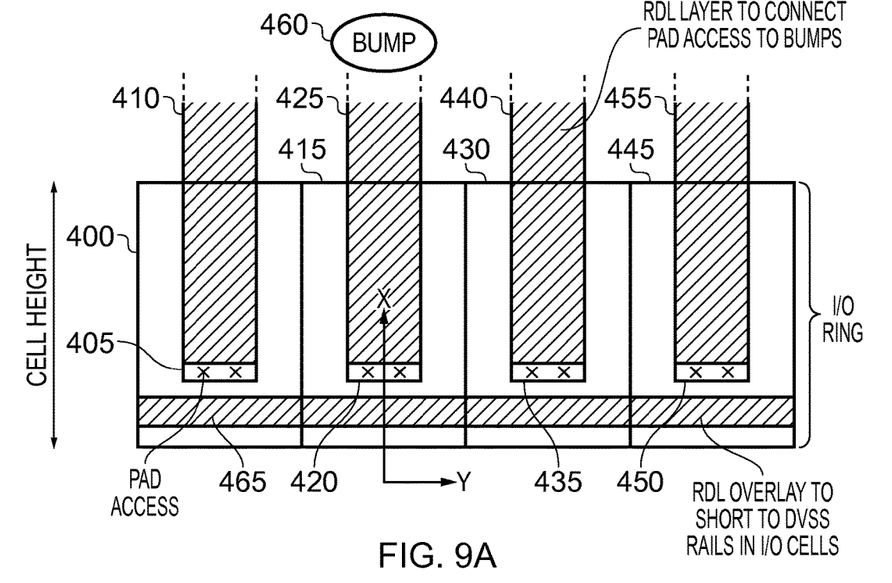
FIGS. 9A and 9B illustrate how the RDL layer may be used in one embodiment to provide a current carrying structure for connection to the DVSS lines of the I/O cells.
Figure 9B:
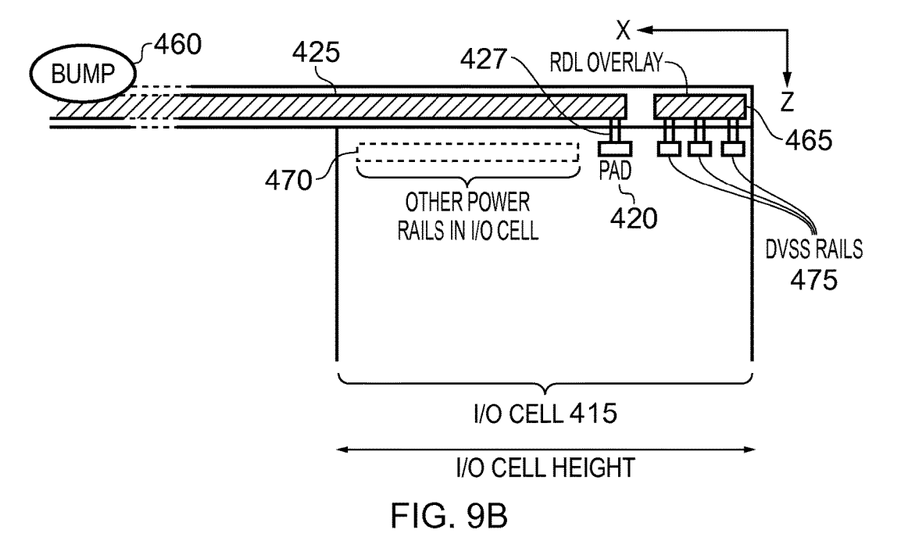

FIGS. 9A and 9B illustrate how the RDL layer may be used to provide the additional current carrying structure for connection to the DVSS rail portions within individual I/O cells. In particular, FIG. 9A shows a number of I/O cells 400, 415, 430, 445, each having a corresponding pad access connection 405, 420, 435, 450, respectively. Through the use of via connections, each pad access connection can be connected to an RDL connection path 410, 425, 440, 455 in the RDL layer, via which the various pad access connections can be connected to appropriate bump connections. For simplicity in FIG. 9A, only one bump connection is shown, namely the bump connection 460 connected to the pad access connection 420 of the I/O cell 415 via the RDL connection path 425. As also shown in FIG. 9A, in an otherwise unused area of the RDL layer, an RDL overlay structure 465 can be provided (for example as a wide metal conductive strip) for providing the current carrying structure required by each of the cells 400, 415, 430, 445.

This arrangement is shown in more detail in FIG. 9B, for the example of the cell 415. As can be seen, the pad access connection 420 is connected by a via 427 to the connection path 425 in the RDL layer, which in turn is connected to the bump connection 460.

The various DVSS rails are shown by the reference numeral 475, and each of those rails is connected by via connections to the RDL overlay 465. As a result, the reduced height DVSS rail portion operates in combination with the RDL overlay 465 to provide a sufficient current carrying capability to support the current carrying constraints of the interface circuitry. This enables the I/O cell height to be reduced when compared with the prior art arrangement of FIG. 3. For completeness in FIG. 9B, the other power rails in the I/O cell are indicated by the dotted box 470.

Whilst the I/O cell arrangement of FIG. 4 can be used to form the I/O cells 400, 415, 430, 445 of FIGS. 9A and 9B, there is no requirement for the connection pins 120. Accordingly, in the arrangement of FIGS. 9A and 9B, the I/O cells can have the more generic structure shown by the I/O cell 500 in FIG. 10. The I/O cell 500 is essentially the same as the I/O cell 100 of FIG. 4, but lacks the connection pins 120 shown in FIG. 4. However, the same reduction in the DVSS rail portion can still be achieved.

Figure 10:
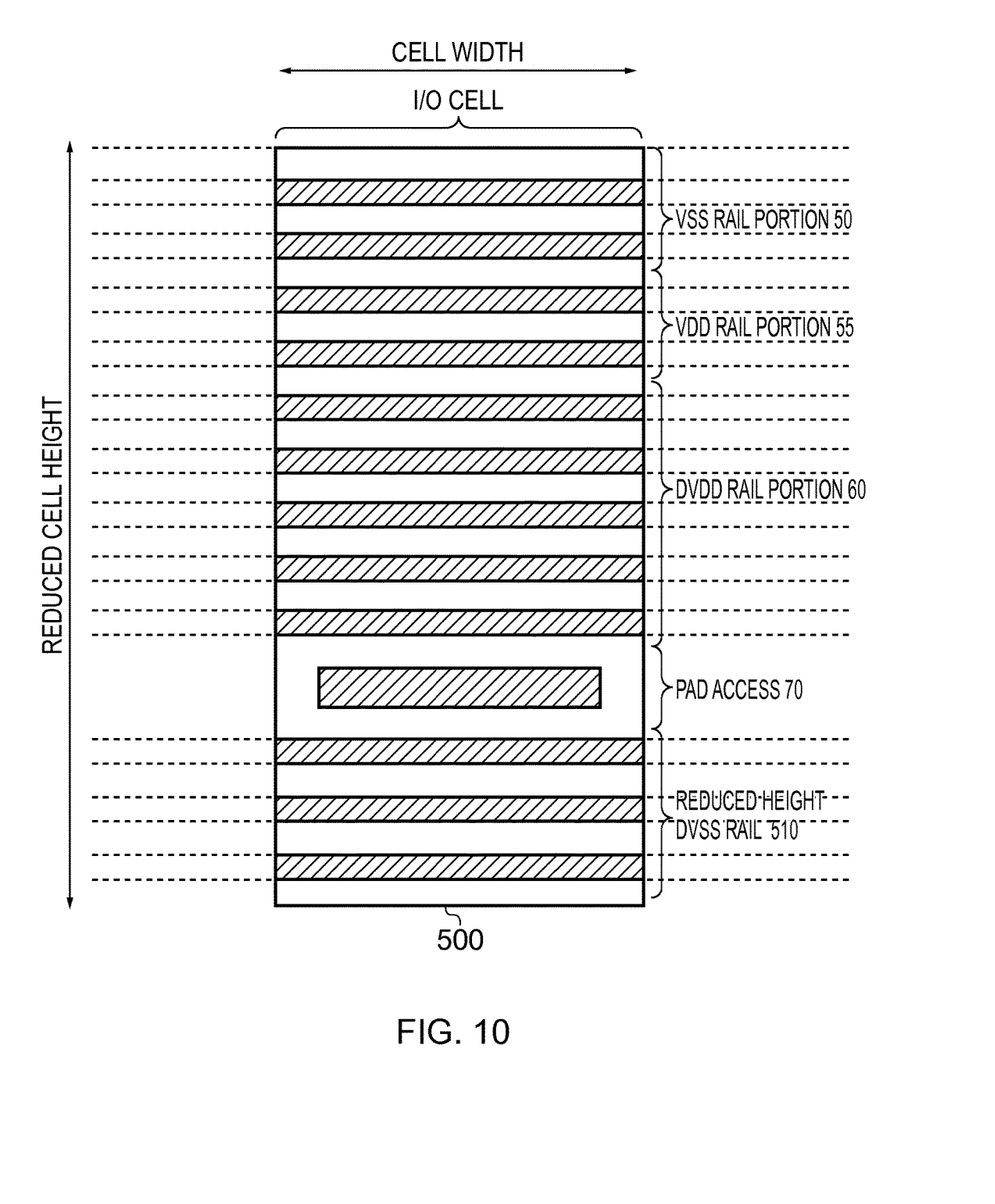
FIG. 10 illustrates a power supply line section associated with an I/O cell in accordance with an alternative embodiment.

For simplicity, the I/O cell in FIG. 10 also does not show the individual metal lines of the reduced height DVSS rail portion as being shorted together via interconnecting lines. However, such shorting of the lines can also be implemented within the I/O cell of FIG. 10. Indeed, such shorting of the lines can also be performed within the various other rail portions 50, 55, 60, both in the embodiment of FIG. 10, and in the earlier described embodiment of FIG. 4.

From the above described embodiments, it will be appreciated that such embodiments enable the overall area associated with the power supply line structure to be reduced, thereby enabling a reduction in the size of the individual I/O cells used to construct the interface circuitry of the integrated circuit. This is achieved whilst still enabling the current carrying constraints to be met. In particular, whilst a first supply line portion is sized to support the current carrying constraint of the interface circuitry, the second supply line portion is not, and instead the second supply line portion is connected to a current carrying structure external to the interface cell, such that the second supply line portion in combination with the connected current carrying structure is sized sufficiently to support the current carrying constraint.

Whilst in the above described embodiments the second supply line portion is considered to be the DVSS rail portion, it will be appreciated that in different embodiments one of the other rail portions could instead be configured as the second supply line portion connected to an external current carrying structure. For example, in one embodiment, the DVDD rail portion may be configured as the second supply line portion.

Although particular embodiments have been described herein, it will be appreciated that the invention is not limited thereto and that many modifications and additions thereto may be made within the scope of the invention. For example, various combinations of the features of the following dependent claims could be made with the features of the independent claims without departing from the scope of the present invention.

The invention claimed is:

1. An integrated circuit comprising:
functional circuitry comprising functional components configured to perform processing functions for the integrated circuit; and
interface circuitry configured to provide an interface between the functional circuitry and components that are external to the integrated circuit,
wherein the interface circuitry comprises a plurality of interface cells having interface components configured to operate from a first power supply,
wherein each interface cell incorporates a power supply line section extending across its width and configured to cooperate with the power supply line section of other interface cells to provide a power supply line structure shared by said plurality of interface cells, for provision of the first power supply to the interface components,
wherein each power supply line section includes a first supply line portion and a second supply line portion, the first supply line portion being sized to support a current carrying constraint of the interface circuitry, and the second supply line portion being sized insufficiently to support said current carrying constraint, and
wherein each interface cell is arranged within the interface circuitry such that the second supply line portion is connected to a current carrying structure external to that interface cell, such that the second supply line portion in combination with the connected current carrying structure is sized sufficiently to support said current carrying constraint.

2. The integrated circuit of claim 1, wherein the plurality of interface cells are arranged in pairs along a length dimension perpendicular to said width, such that one interface cell in a pair abuts against the other interface cell in the pair at an edge boundary.

3. The integrated circuit of claim 2, wherein for each pair of interface cells a connection is provided between the second supply line portions of the interface cells of the pair, such that for each interface cell in the pair the current carrying structure external to that interface cell is provided by the second supply line portion of the other interface cell in the pair.

4. The integrated circuit of claim 3, wherein within each pair of interface cells, the interface cells are configured such that their second supply line portion is provided adjacent said edge boundary.

5. The integrated circuit of claim 4, wherein each pair of interface cells is formed from two identical interface cells, and at the time of providing the pair of interface cells within the interface circuitry the orientation of one interface cell in the pair is flipped in the length dimension with respect to the orientation of the other interface cell of the pair, such that for both interface cells in the pair the second supply line portion is provided adjacent said edge boundary.

6. The integrated circuit of claim 3, wherein each interface cell in the pair comprises a connection area at an end of the interface cell at said edge boundary, via which the connection between the second supply line portions of the interface cells of the pair is made.

7. The integrated circuit of claim 1, wherein the power supply line structure is provided in one or more power layers overlying the interface components, the integrated circuit further comprises at least one additional layer overlying the one or more power layers, and the current carrying structure is provided in said at least one additional layer.

8. The integrated circuit of claim 7, wherein said at least one additional layer comprises a redistribution layer, each interface cell having a pad access terminal, and the redistribution layer being used to provide a connection path between the pad access terminal and a bump connection external to the integrated circuit.

9. The integrated circuit of claim 8, wherein the current carrying structure is provided in an area of the redistribution layer not used for said connection path.

10. The integrated circuit of claim 7, wherein:
the interface circuitry is arranged as an interface ring provided around a periphery of the functional circuitry; and
the power supply line structure provides at least one power supply line extending around the interface ring.

11. The integrated circuit of claim 10, wherein each interface cell is arranged in the interface ring such that in a length dimension perpendicular to said width a first end of the interface cell is adjacent said functional circuitry and a second end is remote from said functional circuitry, the second supply line portion being provided in a region nearer said second end than said first end.

12. The integrated circuit of claim 11, wherein the pad access terminal is positioned between said first end and the second supply line portion, the connection path between the pad access terminal and the bump connection extends in a direction towards the functional circuitry, and the current carrying structure is provided in an area of the redistribution layer at least party overlying said second supply line portion.

13. The integrated circuit of claim 1, wherein the first supply line portion is configured to provide an operating voltage level for said first power supply.

14. The integrated circuit of claim 1, wherein the second supply line portion is configured to provide a ground voltage level for said first power supply.

15. The integrated circuit of claim 1, wherein:
said functional circuitry is configured to operate from a second power supply different to said first power supply;
at least a subset of said interface cells further comprise additional interface components configured to operate from said second power supply; and
the power supply line section of each interface cell includes further supply line portions used to provide said second power supply to said additional interface components.

16. The integrated circuit of claim 1, wherein said current carrying constraint is due to electrostatic discharge (ESD) current requirements of the integrated circuit.

17. An integrated circuit, comprising:
an interface cell for use within interface circuitry of the integrated circuit, wherein the interface circuitry is configured to provide an interface between functional circuitry of the integrated circuit and components external to the integrated circuit, the interface cell comprising:
at least one interface component configured to operate from a first power supply; and
a power supply line section extending across a width of the interface cell and configured to cooperate with the power supply line section of other interface cells to provide a power supply line structure shared with said other interface cells and to provide the first power supply to said at least one interface component;
the power supply line section including a first supply line portion and a second supply line portion, the first supply line portion being sized to support a current carrying constraint of the interface circuitry, and the second supply line portion being sized insufficiently to support said current carrying constraint;
the second supply line portion being configured for connection to a current carrying structure external to the interface cell, such that the second supply line portion in combination with the connected current carrying structure is sized sufficiently to support said current carrying constraint.

18. A non-transitory computer storage medium, comprising:
a cell library, wherein the cell library includes an interface cell for use within interface circuitry of an integrated circuit, the interface circuitry providing an interface between functional circuitry of the integrated circuit and components external to the integrated circuit, the interface cell comprising:
at least one interface component configured to operate from a first power supply; and
a power supply line section extending across a width of the interface cell and configured to cooperate with the power supply line section of other interface cells to provide a power supply line structure shared with said other interface cells, in order to provide the first power supply to said at least one interface component;
the power supply line section including a first supply line portion and a second supply line portion, the first supply line portion being sized to support a current carrying constraint of the interface circuitry, and the second supply line portion being sized insufficiently to support said current carrying constraint;
the second supply line portion being configured for connection to a current carrying structure external to the interface cell, such that the second supply line portion in combination with the connected current carrying structure is sized sufficiently to support said current carrying constraint.

19. A device, comprising:
processing circuitry having processing components; and
interface circuitry configured to interface the processing components with external components,
wherein the interface circuitry comprises first interface cells having first interface components configured to operate from a first power supply,
wherein each first interface cell incorporates a power supply line section extending across its width and is configured to cooperate with a power supply line section of second interface cells to provide a power supply line structure shared by the first interface cells, for provision of the first power supply to the first interface components,
wherein each power supply line section comprises a first supply line portion and a second supply line portion,
wherein the first supply line portion is sized to support a current carrying constraint of the interface circuitry, and the second supply line portion is sized insufficiently to support the current carrying constraint, and
wherein each first interface cell is arranged within the interface circuitry such that the second supply line portion is connected to a current carrying structure external to the first interface cells, such that the second supply line portion in combination with the connected current carrying structure is sized sufficiently to support the current carrying constraint.

20. The device of claim 19, wherein the first interface cells are arranged in pairs along a length dimension perpendicular to the width, such that one first interface cell in a pair abuts against the other first interface cell in the pair at an edge boundary.

* * * * *